(12) United States Patent
Ifis

(10) Patent No.: US 11,013,119 B2
(45) Date of Patent: May 18, 2021

(54) COMPONENT CARRIER WITH DEFORMED LAYER FOR ACCOMMODATING COMPONENT

(71) Applicant: AT&S Austria Technologie & Systemtechnik Aktiengesellschaft, Leoben (AT)

(72) Inventor: Abderrazzaq Ifis, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/929,372

(22) Filed: Apr. 29, 2020

(65) Prior Publication Data

US 2020/0352031 A1 Nov. 5, 2020

(30) Foreign Application Priority Data

May 3, 2019 (EP) ...................... 19172494

(51) Int. Cl.
*H05K 1/18* (2006.01)
*H05K 3/00* (2006.01)
*H05K 3/46* (2006.01)

(52) U.S. Cl.
CPC ............. *H05K 1/183* (2013.01); *H05K 1/185* (2013.01); *H05K 3/005* (2013.01); *H05K 3/4691* (2013.01)

(58) Field of Classification Search
CPC ...... H05K 1/183; H05K 1/185; H05K 3/0014; H05K 3/0044; H05K 3/005; H05K 3/284; H05K 1/188; H05K 1/186; H05K 1/184; H05K 1/189; H05K 3/4697; H05K 3/3415

See application file for complete search history.

(56) References Cited

U.S. PATENT DOCUMENTS

| | | | |
|---|---|---|---|
| 2008/0142940 A1* | 6/2008 | Dunne | H05K 1/186 257/686 |
| 2008/0308976 A1* | 12/2008 | Ito | C04B 35/6342 264/642 |
| 2012/0126388 A1 | 5/2012 | Lin et al. | |
| 2013/0074331 A1 | 3/2013 | Brun | |
| 2018/0177045 A1 | 6/2018 | Schwarz et al. | |

FOREIGN PATENT DOCUMENTS

DE 102010036910 A1 2/2012
FR 2 757 313 A1 6/1998

OTHER PUBLICATIONS

Extended European Search Report in Application No. 19172494.7; dated Jan. 8, 2020; pp. 1-10; European Patent Office, 80298, Munich, Germany.

* cited by examiner

*Primary Examiner* — Jeremy C Norris
(74) *Attorney, Agent, or Firm* — Robert A. Blaha; Smith Tempel Blaha LLC

(57) ABSTRACT

A component carrier which includes a stack having at least one electrically conductive layer structure and/or at least one electrically insulating layer structure, a deformed layer connected to and/or forming part of the stack and being bent so as to define accommodation volumes for components, and the components, wherein each of the components is accommodated in a respective one of the accommodation volumes.

12 Claims, 10 Drawing Sheets

COMPONENT CARRIER WITH DEFORMED LAYER FOR ACCOMMODATING COMPONENT

CROSS-REFERENCE TO RELATED APPLICATIONS

This application claims the benefit of the filing date of the European Patent Application No. 19 172 494.7, filed May 3, 2019, the disclosure of which is hereby incorporated herein by reference.

TECHNICAL FIELD

Embodiments of the invention relate to a method of manufacturing a component carrier, and to a component carrier.

BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Such component carriers shall be mechanically robust and electrically reliable so as to be operable even under harsh conditions.

In particular, efficiently embedding a component in a component carrier is an issue.

SUMMARY

There may be a need to efficiently embed a component in a component carrier.

According to an exemplary embodiment of the invention, a component carrier is provided which comprises a stack comprising at least one electrically conductive layer structure and/or at least one electrically insulating layer structure, a deformed layer connected to and/or forming part of the stack and being bent so as to define accommodation volumes for components, and the components, wherein each of the components is accommodated in a respective one of the accommodation volumes.

According to another exemplary embodiment of the invention, a meth-od of manufacturing a component carrier is provided, wherein the method comprises providing a stack comprising at least one electrically conductive layer structure and/or at least one electrically insulating layer structure, deforming a deformable layer to thereby form a deformed layer which defines at least one accommodation volume for at least one component (in particular a plurality of accommodation volumes for a plurality of components), and accommodating each of the at least one component in a respective one of the at least one accommodation volume.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "deformable layer" may particularly denote a thin film which has the capability of being de-formed into a curved, bent or otherwise three-dimensionally shaped configuration upon applying a mechanical bending force, optionally accompanied by heating. The deformable layer may be elastically deformable or plastically deformable. The deformable layer may have a homogeneous thickness. The deformable layer may be a continuous layer or a patterned layer.

In the context of the present application, the term "deformed layer" may particularly denote a thin film which has been deformed into a curved, bent or otherwise three-dimensionally shaped configuration by the application of a mechanical bending force, optionally accompanied by heating. The deformed layer may be elastically deformed or plastically deformed. The deformed layer may have a homogeneous thickness. The deformed layer may be a continuous layer or a patterned layer.

In the context of the present application, the term "accommodation volume" may particularly denote a recess, cavity or hollow space partially or entirely delimited by the deformed layer and being shaped so as to be capable of accommodating a component.

In the context of the present application, the term "layer structure" may particularly denote a continuous layer, a patterned layer or a plurality of non-consecutive islands within a common plane.

In the context of the present application, the term "stack" may particularly denote an arrangement of multiple planar layer structures which are mounted in parallel on top of one another.

According to an exemplary embodiment of the invention, a component carrier manufacturing concept is provided in which one, two or more components are accommodated at least partially within one or more accommodation volumes defined by the bending characteristic of a deformed layer. In view of the bent and very thin configuration of the deformed layer, it is possible to electrically connect the components over a very short spatial distance and to obtain a highly compact component carrier. In particular, z-axis coupling of the components may be accomplished very efficiently in this way, even when the components have different height. Thus, a highly compact component carrier with short current paths can be provided allowing for an efficient and low-loss transport of electric signals and/or electric energy between the accommodated components, electrically conductive layer structures of the stack and/or an electronic periphery of the component carrier. In view of the freely deformable shape of the deformable layer, it is possible for a circuit designer to highly flexibly establish substantially any desired coupling architecture by correspondingly bending the deformable layer.

In the following, further exemplary embodiments of the method and the component carrier will be explained.

In an embodiment, the deformed layer is a thermo-deformed layer or thermally deformed layer (for instance comprising a thermoplastic material). Correspondingly, the method may comprise thermo-deforming the deformable layer to thereby define the one or more accommodation volumes. In the context of the present application, the term "thermally deformed" or "thermo-deformed" layer may particularly denote a layer processed by thermoforming. In particular, a thermally deformed layer may be the result of a manufacturing process in which a sheet of an appropriate material (for instance a dielectric (in particular plastic) sheet is heated to a pliable forming temperature, formed to a specific shape in a mold, and trimmed to create a (for instance three-dimensionally) bent thermally deformed layer. The layer, sheet, or film may be heated (for instance in an oven) to a sufficiently high temperature that permits it to be stretched into or onto a form, tool or structure and cooled to a finished shape. When configuring the deformed layer as a thermally deformed layer, it is possible to establish a desired deformation for accomplishing a desired component accommodation pattern in a simple way by bringing the layer into a desired deformed configuration and fix the deformed layer in this state by the temporary application of thermal energy. For instance, it is possible to establish such a state by heating a thermally deformable material above a dedicated temperature, for instance a temperature in a range between 150° C. and 200° C. The thermo-deformed layer may then maintain its shape permanently after cooling down to ambient temperature and may therefore be capable of precisely serving as a curved support layer for defining accommodation volumes for one or more components to be embedded in a component carrier.

In an embodiment, the deformed layer comprises at least one of a group consisting of resin, in particular epoxy resin, resin with reinforcing particles, epoxy derivatives such as Ajinomoto Build-up Film® (which may also be denoted as ABF), polyimide, polyamide, and liquid crystal polymer. Ajinomoto® and Ajinomoto Build-up Film® are registered marks of the Ajinomoto Co., Inc., Chuo-ku, Tokyo, Japan. These materials and other flexible materials are capable of being thermo-deformable. In other words, it is possible to bring a layer made of one of the mentioned materials into a three-dimensional bending state and freeze the latter into this three-dimensional configuration by the application of heat. Highly advantageously, the mentioned materials are compatible with component carrier technology, in particular printed circuit board technology and may therefore be properly integrated into the component carrier.

In an embodiment, different accommodation volumes have different shapes and/or different dimensions. By correspondingly adjusting the dimensions of the accommodation volumes by correspondingly defining the shape of the deformed layer, it is possible to balance out height differences between different components to thereby avoid contacting issues and alignment issues.

In an embodiment, the stack comprises a support body having one or more recesses, wherein the deformed layer is attached to the support body and is bent to extend into the one or more recesses so that the one or more accommodation volumes are at least partially arranged in the one or more recesses of the support body. By attaching the deformable layer to the support body and selectively pressing sections of the deformable layer into the recesses of the support body while other portions of the deformable layer rest on the support body and remain non-deformed, a simple, accurate and reliable process of deforming the deformable layer for the formation of one or more accommodation volumes may be provided.

In an embodiment, the deformed layer covers horizontal surface portions and vertical sidewall portions of the support body. During a corresponding manufacturing process, the horizontal surface portions of the deformed layer resting on the support body may be protected from bending, while vertical surface portions of the deformed layer may be pressed into the one or more recesses and onto the sidewalls of the support body.

In an embodiment, the deformed layer bridges the one or more recesses without contact to the support body in the one or more recesses. As a result of the previously described procedure, one or more sections of the deformed layer connecting vertical portions of the deformed layer covering the sidewalls of the support body may freely hang between adjacent portions of the support body. Nevertheless, they delimit accommodation volumes on a top side and/or on a bottom side thereof.

In an embodiment, the component carrier comprises at least one further component arranged in a cavity defined between a bottom of the deformed layer and sidewalls of one of the one or more recesses of the support body. Thus, it is possible that the deformed layer delimits at least one accommodation volume not only above the deformed layer, but—in cooperation with the support body—also below the deformed layer. As a result, the integration density of components in the component carrier may be further increased. Therefore, a component carrier with high compactness and high functionality may be obtained.

In an embodiment, one of the one or more components in one of the one or more accommodation volumes and the at least one further component are arranged above each other separated by the deformed layer. Therefore, the components embedded in accommodation volumes defined by the deformed layer cannot only be stacked side-by-side, but additionally or alternatively also above each another.

In an embodiment, the one or more components located above the de-formed layer may be arranged side by side. In an embodiment, also one or more components located below the deformed layer may be arranged side by side. This ensures a high integration density by keeping the vertical dimension of the component carrier small.

In an embodiment, the deformed layer consists of electrically insulating material. In such an embodiment, the deformed layer may be free of electrically conductive constituents. Therefore, the deformed layer may also provide a reliable electric insulation function. In another embodiment, the deformed layer may comprise a combination of electrically insulating material and electrically conductive material. The latter may then contribute to the wiring of the component carrier.

In an embodiment, shape and dimensions of at least one (in particular of each) of the one or more components substantially corresponds to shape and dimensions of an assigned one of the one or more accommodation volumes. Thus, when a respective one of the components is accommodated in an assigned one of the accommodation volumes, there may remain substantially no void or hollow space between components and deformed layer. Hence, a mechanically robust component carrier may be manufactured in a compact way. A form closure may be established between a component and the assigned accommodation volume in the deformed layer. If a small gap should remain between component and assigned accommodation volume, the gap may be optionally filed by a filling medium (such as a laminate or a mold compound).

In an embodiment, at least one of the one or more accommodation volumes is delimited on one side of the deformed layer and at least one other of the one or more accommodation volumes is delimited on an opposing other side of the deformed layer. The components which are accommodated in the accommodation volumes are then alternatingly located above and below the deformed layer.

In an embodiment, the method comprises deforming the deformable layer to thereby form a plastically deformed layer. When a sufficient (in particular mechanical and/or thermal) load is applied to the material of the deformable layer, it may cause the material to change shape. This change in shape may be called deformation. A temporary shape change that is self-reversing after the force is removed, so that the layer returns to its original shape, may be called elastic deformation. When the stress is sufficient to permanently deform the material of the deformable layer, it may be called plastic deformation. Plastic deformation may involve the breaking of a limited number of atomic bonds by the movement of dislocations. A plastically deformed deformable layer has the advantage that the accommodation volumes delimited by the deformed layer remain permanently in the component carrier without the danger of a loss of a target position of a component by a loss of a properly defined accommodation volume.

In an embodiment, the method comprises deforming the deformable layer by applying mechanical pressure and heat. By taking this measure, in particular a plastic information of the deformable layer may be accomplished with high precision and small effort.

In an embodiment, the method comprises deforming the deformable layer by applying a deforming force by a deforming body which comprises a base and one or more protrusions extending from the base and defining the one or more accommodation volumes. With such a configuration of a de-forming body, the latter may function similar as a punching tool and may punch or emboss a corresponding surface profile into the deformable layer to thereby define the accommodation volume(s).

In an embodiment, the method comprises deforming the deformable layer by pressing the one or more protrusions onto a front side of the deformable layer while a back side of the deformable layer is pressed partially onto a support body and partially into one or more recesses of the support body, which one or more recesses correspond to the one or more accommodation volumes. In particular the combination of a punching or embossing deforming body and a support body with recesses between which the deformable layer may be sandwiched provides a powerful system of precisely forming the accommodation volume(s) of the deformed layer. Descriptively speaking, opposing surfaces of the deforming body and the support body engaging the deformable layer during the formation of the one or more accommodation volumes may correspond to inverse surface profiles. In particular, protrusions of the deformable layer may correspond to recesses of the support body.

In an embodiment, the method comprises inserting each of the one or more components in a respective one of the one or more accommodation volumes so that each of the one or more components is also inserted at least partially into a respective one of the one or more recesses of the support body. In other words, the components may be accommodated in the accommodation volumes of the deformed layer which, in turn, may be partially accommodated in the recesses. A corresponding arrangement may then be used for embedding the components in a highly robust way without the risk of failure.

In an embodiment, the method comprises filling gaps between the deformed layer and the support body at least partially with filling medium, in particular by laminating at least one electrically insulating layer structure to the deformed layer and the support body. Empty spaces or voids in a structure may be filled with a filling medium in order to improve the mechanical integrity of the manufactured component carrier. For instance, one or more at least partially uncured electrically insulating layer structures may be laminated for this purpose. During lamination, i.e. the application of pressure and/or heat, uncured resin material of the electrically insulating layer structure may become flowable so as to flow also into the gaps. After such a melting, a cross-linking of the resin occurs, wherein the resin subsequently re-solidifies into a cured state. For instance, a prepreg layer may be laminated for the purpose of filling gaps.

In an embodiment, accommodating the one or more components in the one or more accommodation volumes is carried out so that upper surfaces of the one or more components and of the deformed layer are aligned with one another, in particular lie in a common plane. When the upper surfaces of components accommodated in the accommodation volumes are in flush with or are aligned with upper surfaces of the deformed layer, a substantially planar surface may be obtained after inserting the components. This simplifies the further processing of the manufactured component carrier, for instance during laminating further layer structures when forming a further build-up. This, in turn, may result in reduced warpage of the manufactured component carrier.

In an embodiment, the method comprises attaching the one or more components on a carrier plate and subsequently approaching the carrier plate to the deformed layer so that each of the one or more components attached to the carrier plate is accommodated in a respective one of the one or more accommodation volumes. Using such a carrier plate with attached components simplifies the procedure of inserting the components into the accommodation volumes, since only a single body, namely the carrier plate, needs to be moved for assembling multiple components on the deformed layer simultaneously.

In an embodiment, the method comprises attaching one or more further components on a further carrier plate and subsequently approaching the further carrier plate to a back side of the deformed layer so that each of the one or more further components attached to the further carrier plate is accommodated in a respective one of one or more further accommodation volumes on the back side of the deformed layer. By such an architecture, it is possible to use accommodation volumes defined on both a front side and a back side of the deformed layer for the accommodation of components. This allows manufacturing component carriers with multiple components accommodated in a highly compact and efficient way.

In an embodiment, the method comprises at least partially filling gaps between the deformed layer, the one or more components and the one or more further components by a filling medium, in particular by molding. Empty spaces or voids in the obtained structure may be filled with a filling medium in order to improve the mechanical integrity of the manufactured component carrier. Molding may denote the process of manufacturing by shaping liquid or pliable raw material using a rigid frame called a mold or matrix. A mold may denote a hollowed-out tool that is filled with a liquid or pliable material such as plastic, glass, metal, or ceramic raw material. The latter material may constitute the mentioned filling medium.

In an embodiment, the method comprises inserting a structure comprising the deformed layer, the one or more components, the one or more further components and optionally filling medium into a cavity formed in the stack.

Thus, a component carrier may be formed in which a (preferably laminated) stack comprising at least one electrically insulating layer structure and/or at least one electrically conductive layer structure comprises a recess or hole in which the arrangement composed of the deformed layer, the component(s), the further component(s) and optionally filling medium can be inserted. By taking this measure, even complex and sophisticated electronic tasks can be carried out.

In an embodiment, the deformed layer is bent so as to define a two-dimensional array of accommodation volumes for components. For instance, the bending procedure may be carried out to bend a planar deformable layer so as to form multiple indentations extending in different directions and defining a two-dimensional (rather than only a one dimensional) array of accommodation volumes. This may allow efficiently using a two-dimensional area of the component carrier for embedding multiple components therein, for instance by stringing them along two different directions. As a result, a compact component carrier with sophisticated electronic functionality may be provided.

In an embodiment, the two-dimensional array comprises at least two accommodation volumes arranged along a length direction and at least two accommodation volumes arranged along a width direction of the planar deformable layer or of the deformed layer, in particular arranged in rows and columns. For example, the components may be arranged in the two-dimensionally deformed layer in a matrix-like pattern. Descriptively speaking, the components may be arranged in the accommodation volumes of the deformed layer in a puzzle-like pattern.

In an embodiment, the two-dimensional array comprises at least one first accommodation volume accommodating at least one heat removal component and comprises at least one second accommodation volume accommodating at least one heat generating component. For instance, heat removal components may be arranged more peripherally than more centrally arranged heat generating components. Such heat removal components may for instance be copper blocks or other thermal modules configured for removing and/or spreading heat generated during operation of the component carrier. The heat generating components may be components such as semiconductor chips generating heat during operation of the component carrier, which heat can be removed and/or spread by the at least one heat removal component. Thus, the two-dimensional arrangement of components may also improve the thermal performance of the component carrier.

In an embodiment, the method comprises deforming the deformable layer to thereby form the deformed layer which defines a two-dimensional array of accommodation volumes comprising at least two accommodation volumes extending along a first direction perpendicular to a stacking direction of the stack and comprising at least two accommodation volumes extending along a second direction perpendicular to the first direction and perpendicular to the stacking direction of the stacked layer structures (compare for instance FIG. 34). The stacking direction may be the direction being oriented perpendicular to the parallel planes defining the stacked layer structures. Descriptively speaking, the stacking direction may be the thickness direction of the component carrier.

In an embodiment, the method comprises deforming the deformable layer to thereby form the deformed layer so that the two-dimensional array of accommodation volumes comprises at least one accommodation volume above and at least one accommodation volume below the deformed layer. For instance, the two-dimensional bent structure may comprise one or more dips or indentations extending from an upper main surface of the deformed layer downwardly and may comprise one or more dips or indentations extending from a lower main surface of the deformed layer upwardly. The components may be accommodated in such a two-dimensionally wavy or undulating deformed layer from the upper main surface and from the lower main surface. Such a concept distributes the components more evenly over the component carrier and therefore suppresses undesired phenomena such as warpage.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, each of the above mentioned electrically insulating layer structures comprises at least one of a group consisting of resin (such as reinforced or non-reinforced resins, for instance epoxy resin or bismaleimidetriazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, each of the above-mentioned electrically conductive layer structures comprises at least one of a group consisting of copper, aluminum, nickel, silver, gold, palladium, and tungsten. Although copper is usually preferred, other materials or coated versions thereof are possible as well, in particular coated with supra-conductive material such as graphene.

In an embodiment, the at least one component can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
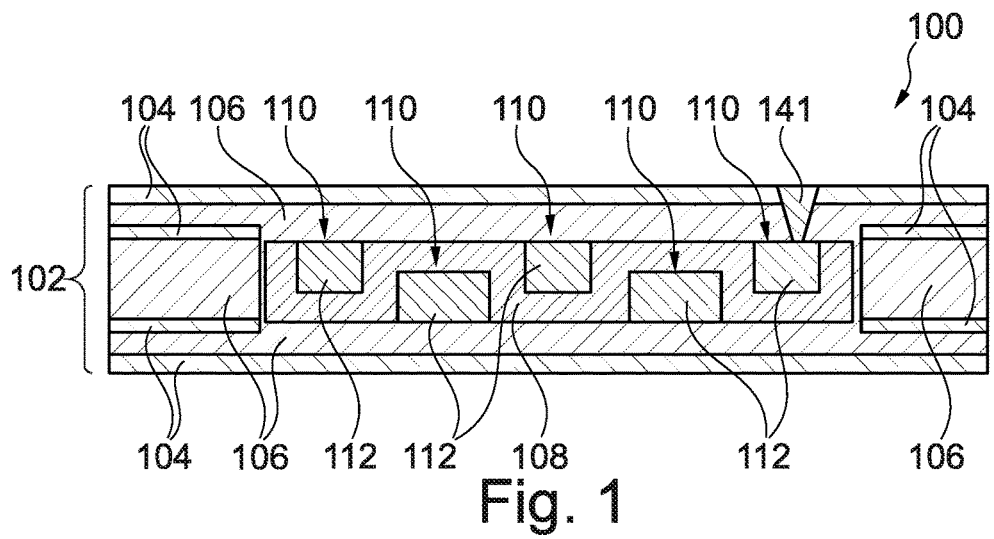
FIG. 1 illustrates a cross-sectional view of a component carrier according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a high dense and flexible embedding of components may be accomplished, in particular using thermoforming and/or transfer embedding. More specifically, electric structures can also be thermoformed together with mold structures, for instance on one side. It may for example be possible to apply electrically conductive features, and then carry out a pressing process.

Embedding a high number of components with different sizes and shapes is conventionally a challenge. Indeed, when creating through cavities and embedding components which have different height, the control of the filling process may be poor. Also, the process of electrically contacting such embedded components (for instance by the formation of copper filled laser vias) may be difficult when the height and therefore distance of the components from an upper main surface of the component carrier are different. Also, with such designs, panels may present warped shapes as the resin or adhesive distribution may be also poor.

In order to overcome the aforementioned and/or other shortcomings, exemplary embodiments of the invention provide an embedding process which is in particular appropriate for highly flexible, reliable and dense embedding tasks. An exemplary embodiment is based on both thermoforming and transfer embedding processes to ensure an accurate control of the cavities or accommodation volumes and the components' positioning.

In particular, embedding components in deep cavities defined by a deformed layer instead of through cavities can be a highly appropriate solution to overcome issues related to shape and height non-uniformity of different components. Such a manufacturing architecture may also allow controlling the amount of the filling material in order to control the panel's warpage.

Exemplary embodiments of the invention in particular provide a possibility of creating the mentioned depth cavities and how to assemble to components inside the correspondingly formed accommodation volumes. Indeed, by using a thermoforming process on a prepreg, resin or epoxy derivative basis such as an epoxy-based build-up film using a thermoforming matrix and a core with cavities, it is easily possible to create a depth cavity with accurately controlled dimensions. However, any other thermo-deformable material can be used.

By controlling the thermoforming temperature, speed and pressure according to an exemplary embodiment, the depth of the cavity can be controlled without letting the material reach its fluid zone. Using this technique, the shapes of the cavities can be flexible. In particular, it may be possible to create deep cavities for thick components, small cavities for small components with also the possibility to create two cavities, one on the front and the other on the back side in case of thick cores. In particular in case of double-sided cavities, another accommodation volume can be used also on the back side.

According to an exemplary embodiment, a registration process for aligning may be carried out after thermoforming. For example, a skiving process or another process can be used to expose alignments markers on a core once thermoforming is done.

When the one or more cavities have been obtained, an embedding process can be performed using transfer embedding. For example, the components to be embedded may be assembled on a rigid sticky board using local coordinates of the core alignments markers in order to ensure high registration accuracy. For example, the thermoforming material (i.e. a thermo-deformable layer) may be an at least partially uncured material (such as a B-stage material) which may be used for filling gaps when the temperature exceeds a curing temperature or a glass temperature. Consequently, filling and fixing can be carried out at the same time.

According to still another exemplary embodiment, double-sided embedding may be accomplished, for instance using the deformed layer. Another rigid board with assembled components can be used for the back side ensuring a high density and also advantageously avoiding the warpage of the panel.

According to an exemplary embodiment, an alignment procedure for transfer embedding can use an image correlation architecture. Such an architecture can even correct alignment errors from previous processes. For example, a camera may scan an area or several areas with multiple components, cavities and alignment markers. Then the scanned image may be compared to the scaled original design. By optimizing the adjusted images, the alignment may be highly accurate for subsequent processes, such as laser processing. To provide such a system, a software and camera may be implemented. They can be included in a lay-up station design.

Once the transfer is completed, curing can be done by heating and pressing the whole system. As the components may be stuck to the board, controlled height and positions may be ensured for the subsequent processing (for instance laser processing, imaging, etc.). As filling may be done using a prepreg in an exemplary embodiment of the invention, there is no additional material that could induce for instance mismatch or voluminous shrinkage. Therefore, a high reliability can be ensured.

Next, support removal will be described. Once the curing is finished, the support can be peeled off using low shear stress. Then, the panel may proceed to a pressing procedure.

An embedding architecture according to an exemplary embodiment of the invention may allow obtaining a high degree of design freedom. In particular, the embedding can be done at advanced steps. More specifically, the embedding can be done at advanced steps during the component carrier (in particular printed circuit board, PCB) production (any layer or multi-layer, both is possible in different embodiments). In particular, the embedding can not only be done on a core layer, but also later on after buildup of further electrically conductive and/or electrically insulating layer structures. It is also possible to perform double-sided embedding.

An exemplary embodiment of the invention provides a process for depth cavity formation and filling using thermoforming. Advantageously, double-sided embedding may be carried out in one procedure. In terms of productivity, a highly automated and integrated embedding architecture may be provided. A corresponding procedure may involve less handling and risk for failure. Beyond this, a high time-saving may be accomplished.

In terms of reliability, exemplary embodiments of the invention may provide an accurate cavity processing and an easy and reliable filling. Moreover, an accurate placement of components may be ensured. Furthermore, a proper control of the components may be achieved. Apart from this, the embedding stress level may be low. Advantageously, a bubble free filling process may be carried out, and warpage may be kept very small.

Furthermore, the architecture of exemplary embodiments of the invention may provide the opportunity to embed in any manufacturing procedure of the entire process. Beyond this, the manufacturing architecture according to an exemplary embodiment supports a wide range of core thickness and components heights. Moreover, exemplary embodiments render it possible to embed in different cavity shapes (for instance depth cavities shaped as blind hole, through cavities shaped as through hole, cavities formed using a release layer with intentionally poor adhesion properties relative to surrounding component carrier material). Other exemplary embodiments allow embedding components with different components sizes (in particular different component heights) in the same core and with the same pressing cycle. Moreover, exemplary embodiments provide the possibility of flexibly supporting different kinds of build-ups. Exemplary embodiments of the invention are compatible with mass production volumes on industrial scale and involve less handling than conventional approaches as well as a high degree of automation.

Component carriers manufactured according to exemplary embodiments of the invention have a high reliability and allow obtaining a high yield. Moreover, a high flexibility for build-ups and designs can be achieved. Space requirements can be relaxed. Furthermore, exemplary embodiments may enable to embed different component heights.

Other exemplary embodiments provide the possibility to embed one or more components on both sides of a deformable or deformed layer. In a high-density embedding embodiment, multiple components may be embedded in the same cavity. Moreover, there is the possibility of a fan-out on both sides of the deformed layer. A high accuracy and registration can be ensured by exemplary embodiments of the invention.

In exemplary embodiments, there is a large freedom to select materials and component sizes, while high reliable embedded packages may be formed. It may also be possible in exemplary embodiments to embed components of different sizes and/or of different shapes in the same stack (in particular core).

In another embodiment, molding can be used for embedding components additionally or alternatively to the above-described thermo-deforming concept.

FIG. 1 illustrates a cross-sectional view of a component carrier 100 according to an exemplary embodiment of the invention.

The component carrier 100 according to FIG. 1 is configured as a plate-shaped laminate-type component carrier, more specifically as a printed circuit board (PCB). The component carrier 100 comprises a laminated stack 102 comprising electrically conductive layer structures 104 and electrically insulating layer structures 106. For instance, the electrically insulating layer structures 106 may comprise resin (such as epoxy resin), optionally with reinforcing particles (such as glass fibers or glass spheres). The electrically conductive layer structures 106 may comprise patterned metal layers (in particular patterned copper foils) and vertical through connections (in particular copper filled laser vias). In the shown embodiment, a recess or cavity is delimited by the stack 102 in an interior thereof.

A thermo-deformed layer 108 of the component carrier 100 is accommodated in the above-mentioned recess or cavity of the stack 102 and is plastically deformed. The thermo-deformed layer 108 is bent with a rectangular wave shape so as to define multiple accommodation volumes 110, each accommodating a respective one of multiple electronic components 112 such as semiconductor chips. For example, the deformed layer 108 may the made of epoxy resin or polyimide. Preferably, the deformed layer 108 consists of a homogeneous dielectric or electrically insulating material with constant thickness. In view of its dielectric properties, the deformed layer 108 also contributes to the electric isolation between the different components 112. As can be taken from FIG. 1, different ones of the components 112 have different shapes and different dimensions corresponding to different shapes and different dimensions of different accommodation volumes 110.

The various components 112 are arranged side by side, i.e. laterally juxtaposed. Moreover, the components 112 are arranged for being located alternatingly above the deformed layer 108 and below the deformed layer 108, respectively. Upper main surfaces of the components 112 which are embedded above the deformed layer 108 are aligned with each other and with the upper main surface of the deformed layer 108. Correspondingly, lower main surfaces of the components 112 which are accommodated below the deformed layer 108 are aligned with each other and with the lower main surface of the deformed layer 108. As a result, a highly compact component carrier 100 is obtained with high mechanical integrity. Furthermore, the formation of electrically conductive contacts (schematically shown for one of the components 112 in FIG. 1 as copper filled laser via 141) for contacting (in particular one or more pads, not shown, on) upper main surfaces of the components 112 above the deformed layer 108 is simplified, because correspondingly formed vertical through connections (see reference numeral 141) extend to the same vertical thickness for all of these components 112 above the deformed layer 108. Also electrically contacting lower main surfaces of the components 112 below the deformed layer 108 is simplified by the described aligned configuration, because correspondingly formed vertical through connections (not shown) extend up to the same vertical thickness for all of these components 112 below the deformed layer 108.

During a manufacturing process, the deformed layer 108 may be plastically deformed by a corresponding thermal and mechanical treatment so as to assume the rectangular wave shape shown in FIG. 1. By taking this measure, accommodation volumes 110 (compare also FIG. 3) may be defined exclusively by the shape of the deformed layer 108. Due to the shown wave shape, accommodation volumes 110 are delimited above and below the deformed layer 108. After inserting (and optionally adhering) the components 112 in the various accommodation volumes 110, the so obtained body may be inserted into the cavity in the stack 102 and may be interconnected with the stack 102 by lamination of layer structures 104, 106 on the top side and on the bottom side of the deformed layer 108 and of the accommodated components 112 and on the top side and the bottom side of the inner layer structures 104, 106 defining the cavity in the stack 102.

FIG. 2 to FIG. 10 illustrate views of structures obtained during carrying out a method of manufacturing a component carrier 100 with embedded components 112 according to an exemplary embodiment of the invention.

Figure 2:
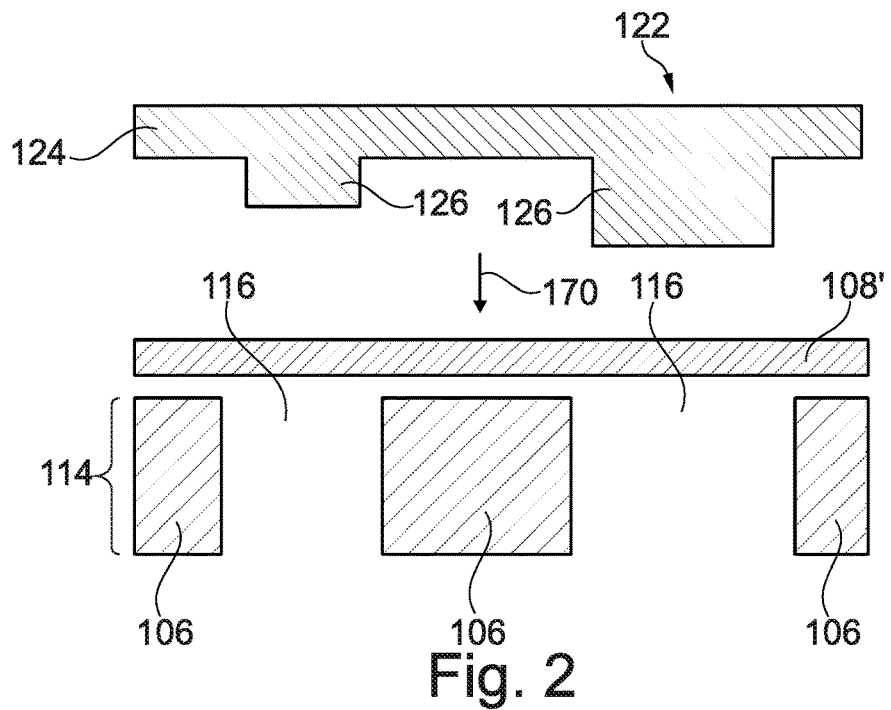
FIG. 2, FIG. 3, FIG. 4, FIG. 5, FIG. 6, FIG. 7, FIG. 8, FIG. 9 to FIG. 10 illustrate views of structures obtained during carrying out a method of manufacturing a component carrier with embedded component(s) according to an exemplary embodiment of the invention.

Referring to FIG. 2, a planar and still plastically deformable layer 108' (which may hence be still uncured) is shown which will be deformed during the manufacturing method to thereby form the deformed layer 108 of FIG. 1.

For deforming the deformable layer 108' by applying a deforming force, the deformable layer 108' is sandwiched between a deforming body 122 and a support body 114. The deforming body 122, which is arranged on top of the deformable layer 108', comprises a plate shaped base 124 and—in the shown embodiment two—protrusions 126 extending from the base 124 downwardly towards the deformable layer 108'. The shape of the protrusions 126 contributes to the definition of shape and dimension of the accommodation volumes 110. Descriptively speaking, the protrusions 126 form a matrix with component shape, i.e. with the shape of the components 112 to be accommodated in the accommodation volumes 110 to be formed. The support body 114, which is arranged on bottom of the deformable layer 108', comprises an electrically insulating layer structure 106 (for instance a core of fully cured FR4 material) provided with—in the shown embodiment two—recesses 116 which are reconfigured as through holes. As can be taken from FIG. 2, the positions of the protrusions 126 are aligned to the positions of the through holes 116 in a vertical direction.

Deforming the deformable layer 108' to convert the latter into the deformed layer 108 may then be accomplished by pressing the protrusions 126 onto a front side of the deformable layer 108' while a back side of the deformable layer 108' is pressed partially onto the support body 114 and partially into the recesses 116 of the support body 114. These recesses 116 correspond to the formed accommodation volumes 110.

Thus, thermoforming of the deformable layer 108' is carried out for depth cavity creation, i.e. for the formation of the various accommodation volumes 110. For this purpose, the material of the deformable layer 108' may be a material with thermo-forming abilities such as prepreg, ABF, resin, etc. A thermo-forming matrix which is here denoted as deforming body 122 may be made for example by modelling, machining or assembly of dummy components on a stiff board. The support body 114 may be embodied as a core or a multi-layer with cavities as the recesses 116.

In an embodiment, in which the support body 114 remains part of the readily manufactured component carrier 100, the support body 114 may form part of the stack 102 as shown in FIG. 1. In other embodiments, it is possible that the support body 114 is only a temporary support body which is removed before completing the formation of the component carrier 100 and therefore does not form part of the readily manufactured component carrier 100 in such an embodiment.

Figure 3:
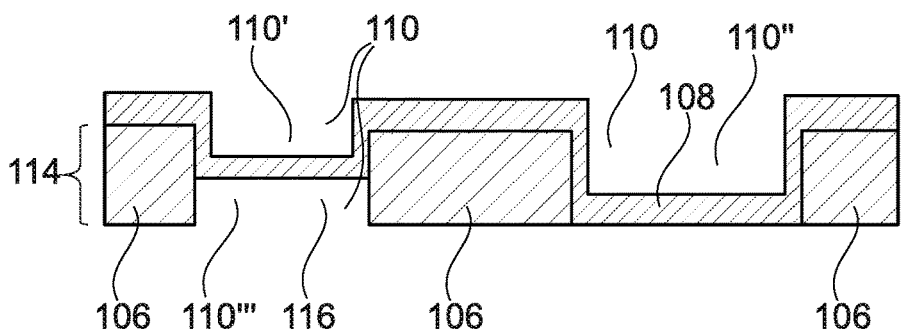

Referring to FIG. 3, an arrangement is shown which is the result of the procedure described referring to FIG. 2 when the deforming body 122 has been moved downwardly (compare reference numeral 170 of FIG. 2) so that the deformable layer 108' is engaged and thereby deformed between the deforming body 122 and the support body 114. Alternatively, the support body 114 may be moved upwardly while the deforming body 122 remains stationary, or both the deforming body 122 and the support body 114 may be moved in opposite directions to engage the deformable layer 108' in between. The procedure of deforming the deformable layer 108' by applying mechanical pressure may be—optionally, but preferably—accompanied by heat to further promote thermo-deformation.

As shown in FIG. 3, the deformed layer 108 deformed as a result of the described procedure is attached to the support body 114 and is bent to extend into the recesses 116. Thus, the accommodation volumes 110 are partially arranged in the recesses 116 of the support body 114. Thus, the deformed layer 108 covers horizontal surface portions and vertical sidewall portions of the support body 114. Furthermore, the deformed layer 108 bridges the recesses 116 without contact to the support body 114 in the recesses 116.

In other words, depth cavities in form of accommodation volumes 110 are obtained after thermoforming. Preferably, the material of the deformed layer 108 may stay in an at least partially uncured state (for instance in a B-stage) so that it may be advantageous used for filling gaps in a subsequent lamination procedure.

Advantageously, the deformed layer 108 provides accommodation volumes 110', 110'' above the deformed layer 108 and facing away from the support body 114 as well as an accommodation volume 110''' below the deformed layer 108 and facing towards the support body 114. While the accommodation volumes 110', 110'' are delimited exclusively by the de-formed layer 108, the accommodation volume 110''' is delimited partially by the deformed layer 108 and partially by the support body 114. In particular, a double-sided cavity configuration is formed by the accommodation volumes 110', 110'''. Relatively shallow components 112 may be placed in these accommodation volumes 110', 110'''. In contrast to this, a relatively thick component 112 may be placed in accommodation volume 110''.

Figure 4:
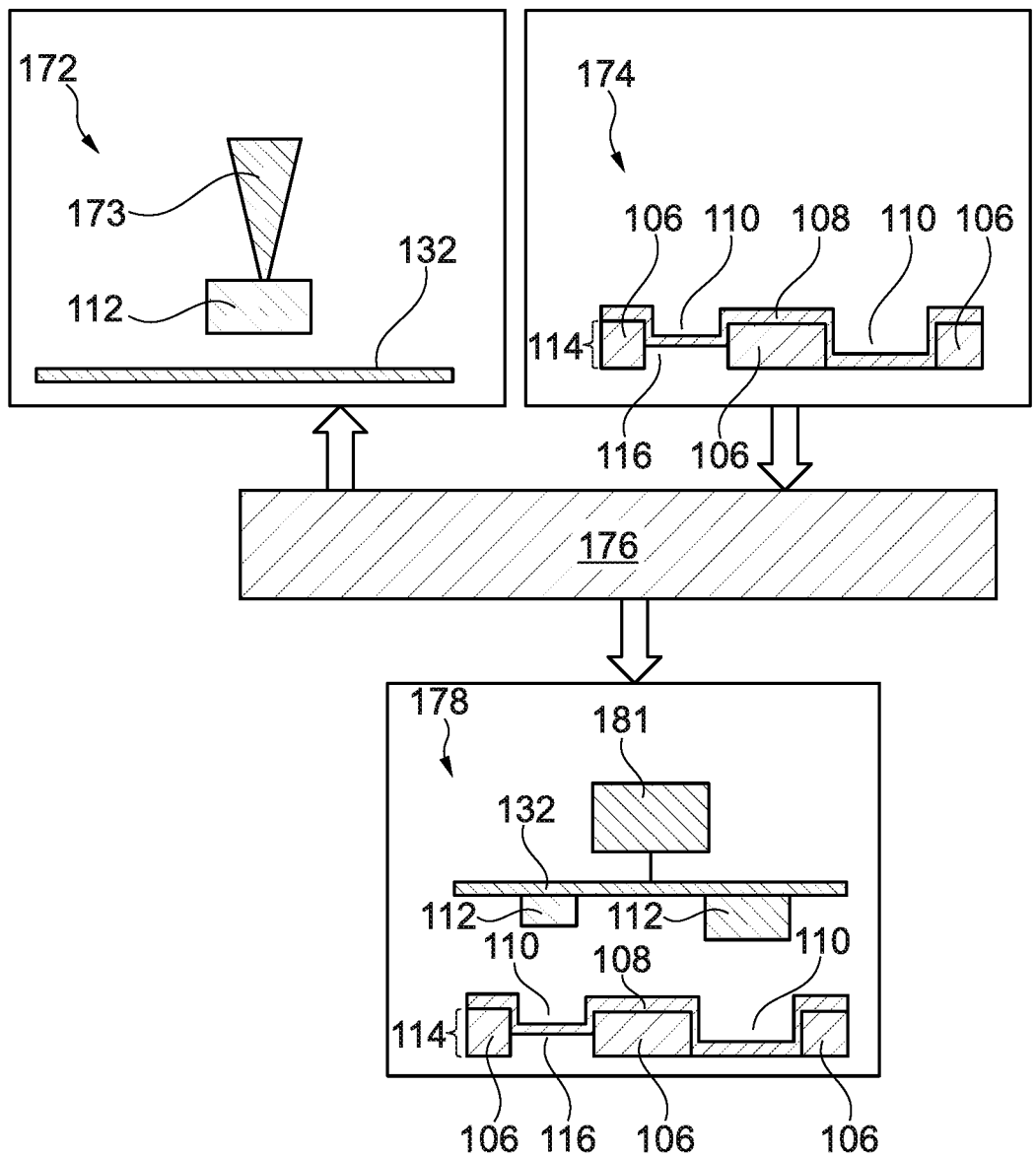

Referring to FIG. 4, it is shown how the components 112 can be assembled in the accommodation volumes 110 by transfer embedding.

As can be taken from reference numeral 172, the shown component 112 may be attached by a sampling head 173 on a sticky surface of a carrier plate 132.

Reference numeral 174 shows core preparation as described above referring to FIG. 2 and FIG. 3. Skiving may be used to expose inner alignment markers (not shown in FIG. 4) of the illustrated layer stack.

Reference numeral 176 illustrates schematically that a system for data and information exchange, alignment, etc. may coordinate the described procedures. In particular, it is possible to use local alignment markers on the core-type support body 114 for assembly on a rigid board.

Reference numeral 178 illustrates how a loading system 181 operates the carrier plate 132 with the adhered components 112 for placing each of the components 112 into a respective one of the accommodation volumes 110. This can be accomplished for all components 112 to be arranged on one side of the deformed layer 108 in a common single simultaneous procedure. Thus, each of these components 112 is inserted in a respective one of the accommodation volumes 110.

Figure 5:
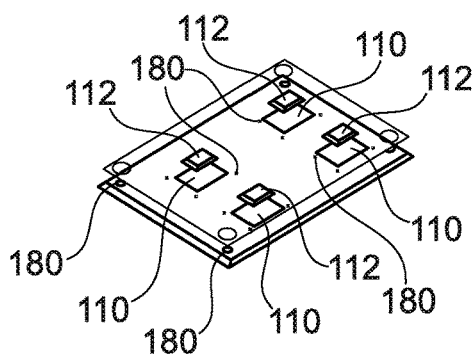
Figure 6:
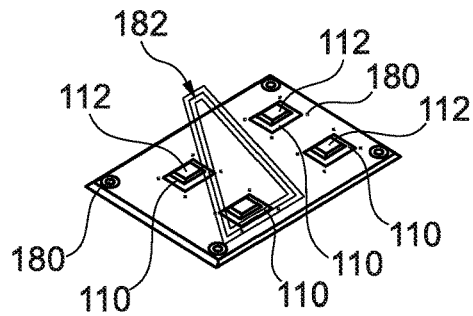

FIG. 5 and FIG. 6 show image correlation during transfer embedding. Image correlation occurs for the components 112 versus alignment markers 180 and cavities/accommodation volumes 110. FIG. 5 shows a first global alignment. FIG. 6 shows a multiple area scan using a camera illustrated schematically with reference numeral 182.

Figure 7:
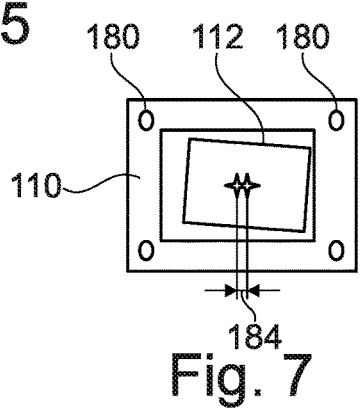

FIG. 7 illustrates shift/rotation correction using adaptive alignment. Shift and rotation are indicated by reference numeral 184.

In the framework of the described manufacturing method, it is furthermore possible that a correction procedure is carried out during which a design can be updated by shifting and rotating each component 112 according to scanned values. It is furthermore possible to subsequently drill and expose according to an updated design.

Figure 8:
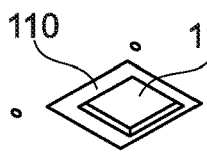
Figure 9:
Figure 10:
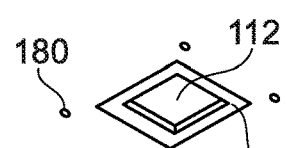

FIG. 8 illustrates scanned images at layup, FIG. 9 shows an original design and FIG. 10 shows a design after correlation.

Figure 11:
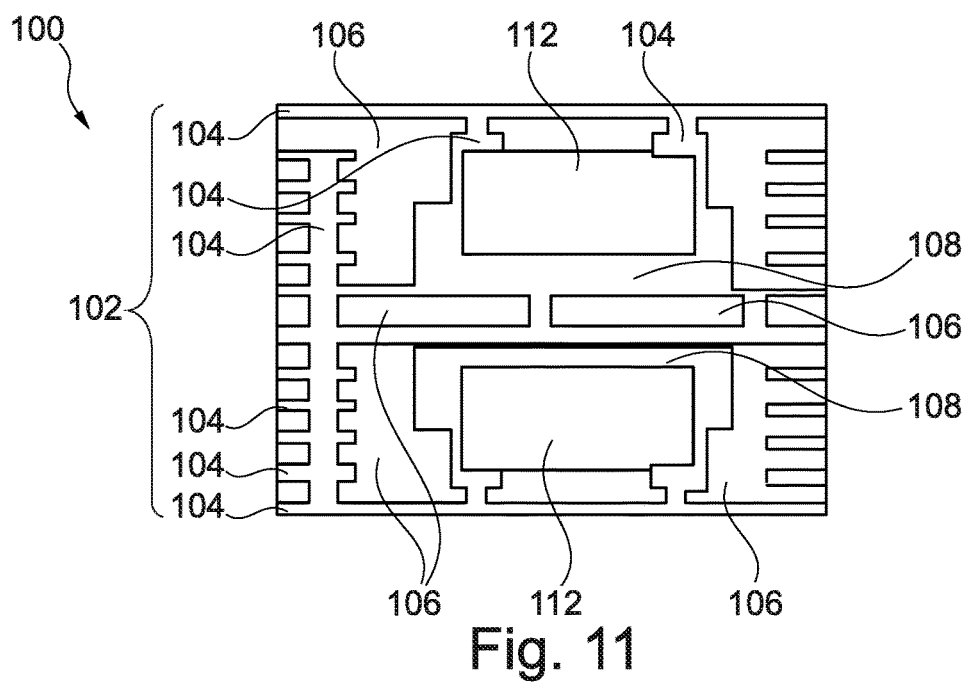
FIG. 11 illustrates a cross-sectional view of a component carrier according to another exemplary embodiment of the invention.

FIG. 11 illustrates a cross-sectional view of a component carrier 100 according to another exemplary embodiment of the invention. The embodiment of FIG. 11 (which may be denoted as a double-sided design at advanced layer step) shows that the described embedding concept allows a high degree of design freedom. Thus, the embedding of components 112 can be carried out at advanced steps. More specifically, the embedding can also be done at advanced procedures during the manufacture of the component carrier 100, for instance after further build up on a central core. It is also possible to perform double-sided embedding.

Figure 12:
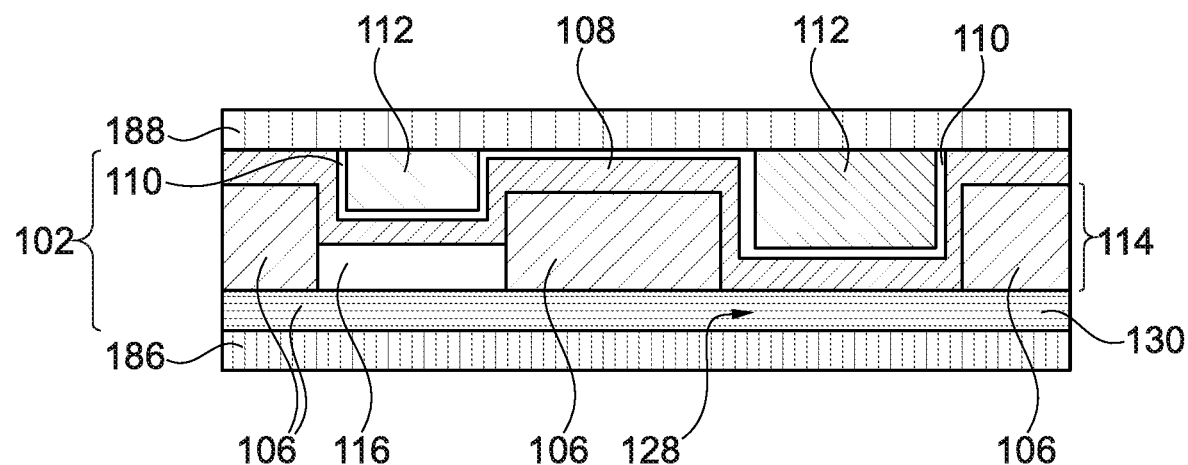
FIG. 12, FIG. 13 to FIG. 14 illustrate cross-sectional views of structures obtained during carrying out methods of manufacturing component carriers with embedded components according to exemplary embodiments of the invention.
Figure 13:
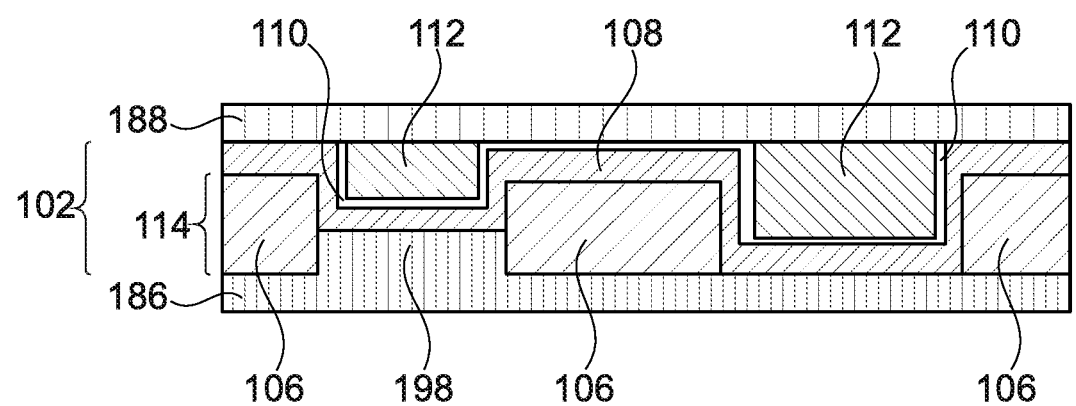
Figure 14:
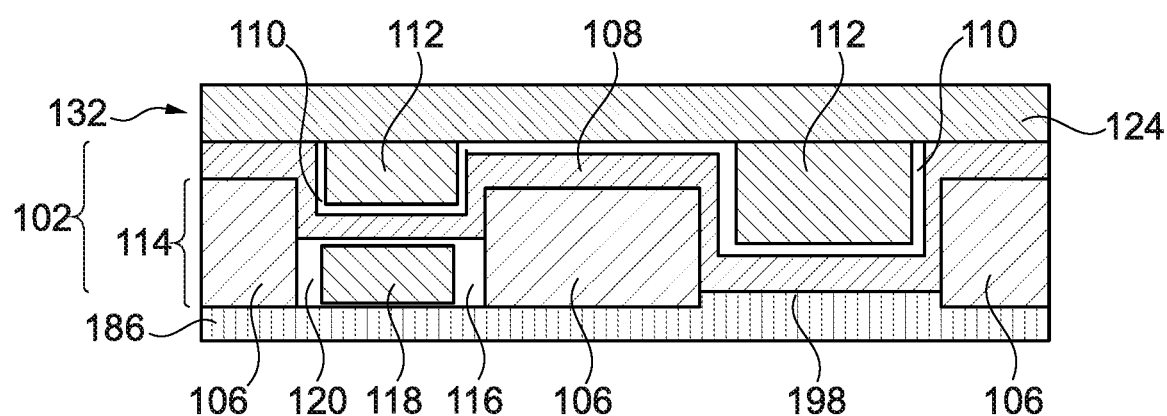

FIG. 12 to FIG. 14 illustrate cross-sectional views of structures obtained during carrying out methods of manufacturing component carriers 100 with embedded components 112 according to exemplary embodiments of the invention.

Referring to FIG. 12, a component carrier 100 or a pre-form thereof is shown which can be obtained based on a manufacturing method as described referring to FIG. 4. Thereafter, an uncured layer structure of filling medium 130 (for instance a prepreg sheet) may be placed on bottom of the obtained structure. The resulting arrangement may be sandwiched between a (preferably stiff) bottom plate 186 and a (preferably stiff) top plate 188. The uncured layer structure of filling medium 130 and—optionally, but preferably—also the preferably still at least partially uncured deformed layer 108 may be cured by being pressed between plates 186, 188 (preferably accompanied by the application of heat). As a result, the filling medium 138 and preferably also the deformed layer 108 may be cured by melting and re-solidifying so as to fill gaps 128. By taking this measure, the gaps 128 between the deformed layer 108, the support body 114 and the components 112 may be filled partially or entirely with filling medium 130 and optionally by flowing medium of the deformed layer 108. As an alternative to the described lamination procedure, the filling medium 130 may also be a mold compound configured for filling gaps 128 by molding.

In one embodiment, the bottom plate 186 and the top plate 188 may be pressing plates for laminating the layer structure of filling medium 130 and the arrangement of support body 114, deformed layer 108 and components 112 together. In this embodiment, plates 186, 188 may then be removed and hence do not form part of the readily manufactured component carrier 100.

In another embodiment, the bottom plate 186 and the top plate 188 may be made of component carrier material (such as a core, a copper foil, a prepreg sheet, etc.) and may therefore form part of the readily manufactured component carrier 100.

As can be taken from FIG. 12, shape and dimensions of each of the components 112 substantially corresponds to shape and dimensions of an assigned one of the accommodation volumes 110.

The embodiment of FIG. 12 relates to a single side transfer embedding architecture adding filling material in form of filling medium 130 to flow into gaps 128 in the layer arrangement.

Referring to FIG. 13, the shown manufacturing method differs from the manufacturing method according to FIG. 12 in that bottom plate 186 is not embodied as a planar plate but comprises a protrusion 198 at a top surface thereof facing the deformed layer 108. Descriptively speaking, bottom plate 186 functions in FIG. 13 as a second matrix having a reversed design. In other words, it is possible to equip bottom plate 186 with a dummy component.

Referring to FIG. 14, an embodiment will be described providing a double-sided embedding. The embodiment according to FIG. 14 differs from the manufacturing method according to FIG. 12 in particular in that bottom plate 186 is not embodied as a planar plate but comprises a protrusion 198 at a top surface thereof facing the deformed layer 108 as well as an attached further component 118 to be inserted into recess 116 which is delimited between a bottom side of the deformed layer 108 and sidewalls of the support body 114. Descriptively speaking, the bottom plate 186 with protrusion 198 and further component 118 is configured as a matrix with a real component (in form of further component 118) and a dummy component (in form of protrusion 198). Thus, the component carrier 100 manufactured according to FIG. 14 comprises further component 118 arranged in a cavity 120 defined between a bottom of the deformed layer 108 and sidewalls of one of the recesses 116 of the support body 114. As a result, one of the components 112 in one of the accommodation volumes 110 above the deformed layer 108 on the one hand and the further component 118 below the deformed layer 108 on the other hand are arranged above each other separated by the deformed layer 108. In other words, the component carrier 100 according to FIG. 14 not only comprises components 112 on the front side of the deformed layer 108, but also a further component 118 on the back side of the deformed layer 108.

Figure 15:
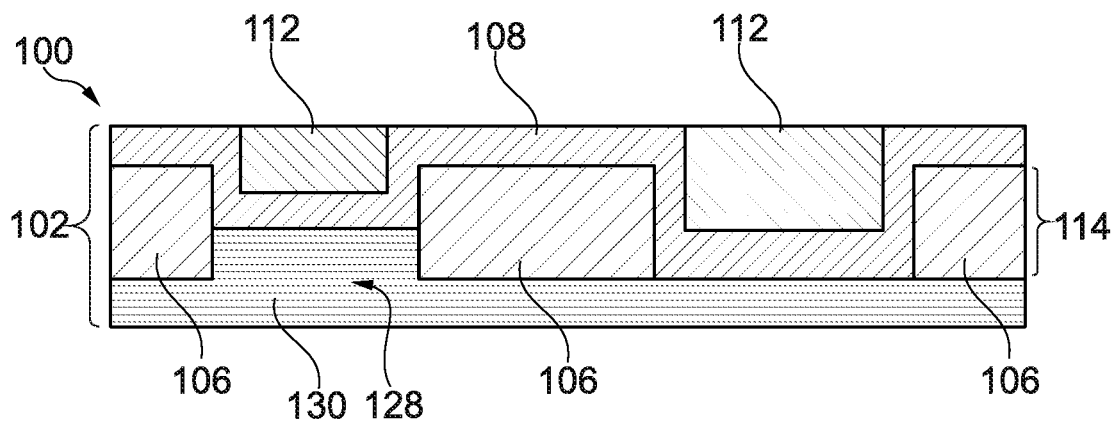
FIG. 15, FIG. 16 to FIG. 17 illustrate cross-sectional views of component carriers with embedded components according to exemplary embodiments of the invention.
Figure 16:
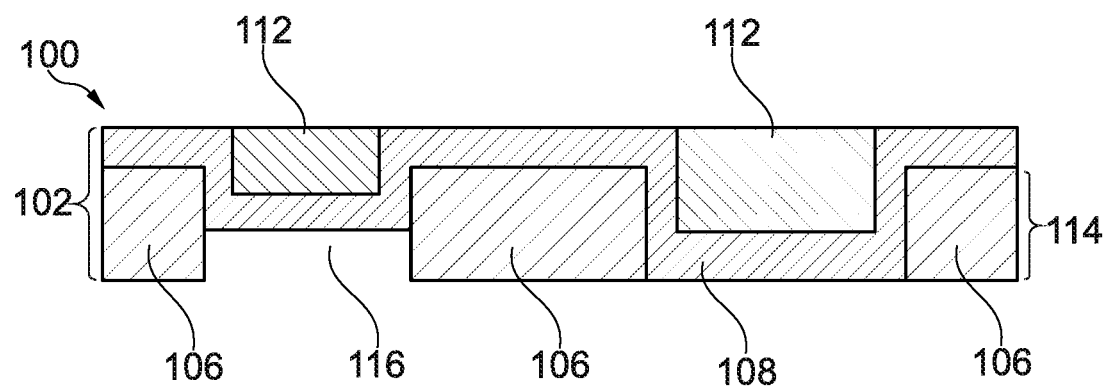
Figure 17:
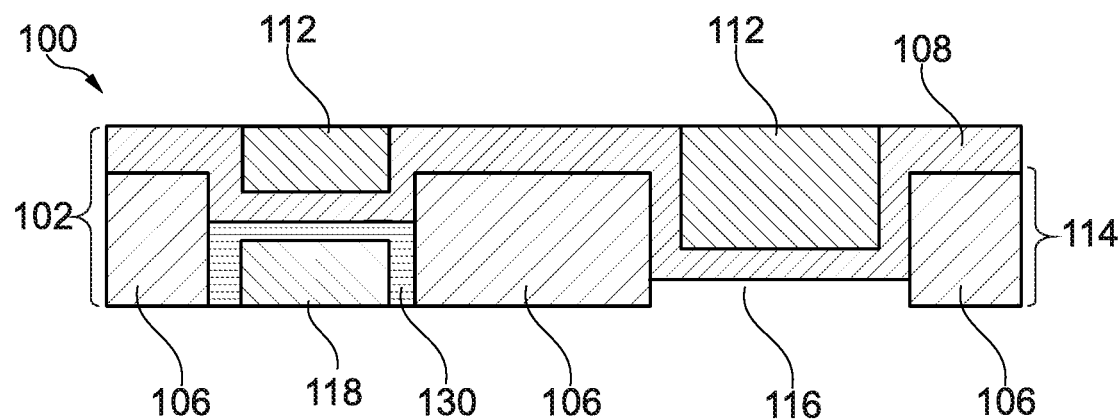

FIG. 15 to FIG. 17 illustrate cross-sectional views of component carriers 100 with embedded components 112 according to exemplary embodiments of the invention.

Referring to FIG. 15, a component carrier 100 according to an exemplary embodiment of the invention is shown which can be manufactured in accordance with FIG. 12. The embodiment of FIG. 15 uses a depth cavity for transfer embedding. It is possible to provide a fan-out on the top side as the position of the components 112 is well defined.

Referring to FIG. 16, a component carrier 100 according to an exemplary embodiment of the invention is shown which can be manufactured in accordance with FIG. 13. This embodiment shows an even thinner build-up.

Referring to FIG. 17, a component carrier 100 according to an exemplary embodiment of the invention is shown which can be manufactured in accordance with FIG. 14. A particularly high component density can be obtained in this embodiment. Furthermore, the use of both sides for fan-out is possible.

FIG. 18 to FIG. 23 illustrate views of structures obtained during carrying out a method of manufacturing a component carrier 100, shown in FIG. 1, with embedded components 112 according to another exemplary embodiment of the invention.

Figure 18:
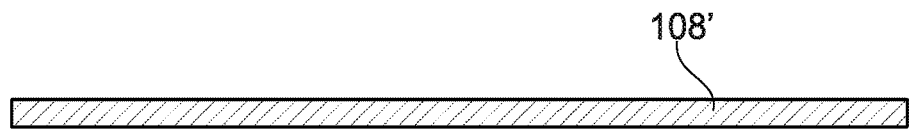
FIG. 18, FIG. 19, FIG. 20, FIG. 21, FIG. 22 to FIG. 23 illustrate views of structures obtained during carrying out a method of manufacturing a component carrier, shown in FIG. 1, with embedded components according to another exemplary embodiment of the invention.

Referring to FIG. 18, a continuous planar thin film of thermo-deformable material is shown as deformable layer 108'.

Figure 19:
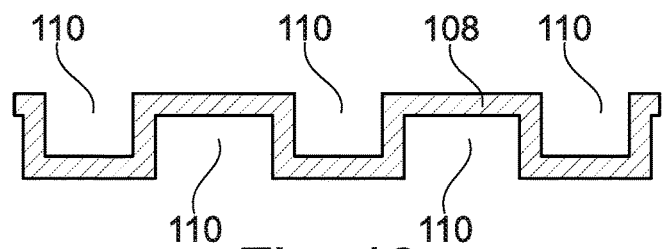

Referring to FIG. 19, a thermo-deformed layer 108 is shown which can be manufactured by plastically deforming the deformable layer 108' of FIG. 18 by heating and mechanically bending. As a result, accommodation volumes 110, each configured for accommodating a respective component 112, can be obtained on both opposing main surfaces of the deformed layer 108. As shown in FIG. 19, some of the accommodation volumes 110 are delimited on an upper side of the deformed layer 108 and other ones of the accommodation volumes 110 are delimited on a lower side of the deformed layer 108. The deformed layer 108 is deformed with a rectangular wave shape. Alternatively, it is also possible that the deformed layer 108 is deformed in a concave deep cavity or any other geometry depending on the cavity form used for accommodating the component 112 to be inserted properly. For instance, such cavities may be cavities for a 3D sensor, may be an antenna cavity, etc.

Figure 20:
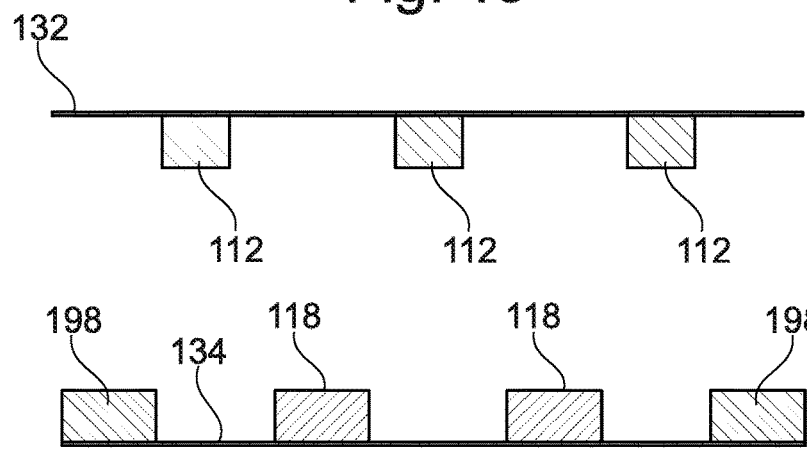

Referring to FIG. 20, components 112 are attached on a lower main surface of a planar carrier plate 132. Further components 118 are attached on an upper main surface of a further carrier plate 134. The further carrier plate 134 also comprises protrusions 198 which may also be denoted as dummy components.

Figure 21:
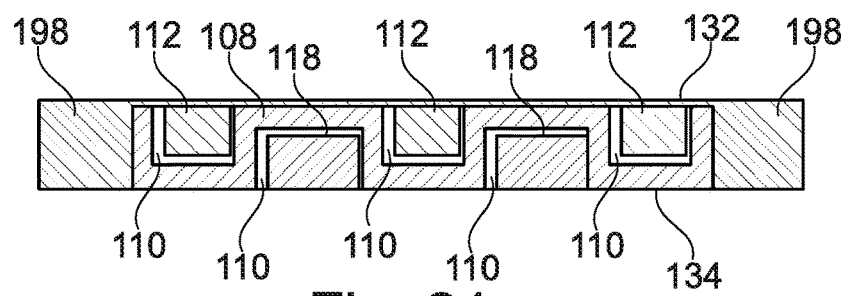

Referring to FIG. 21, the deformed layer 108 is sandwiched between the carrier plate 132 and the further carrier plate 134 equipped with the components 112, 118 as shown in FIG. 20. Subsequently, the carrier plate 132 is approached to the deformed layer 108 by moving the carrier plate 132 in a downward direction so that each of the components 112 attached to the carrier plate 132 is accommodated in a respective one of the accommodation volumes 110. Correspondingly, the further carrier plate 134 is approached to a back side of the deformed layer 108 so that each of the further components 118 attached to the further carrier plate 134 is accommodated in a respective one of further accommodation volumes 110 on the back side of the deformed layer 108. As a result of this procedure, the arrangement of FIG. 21 is obtained.

Figure 22:
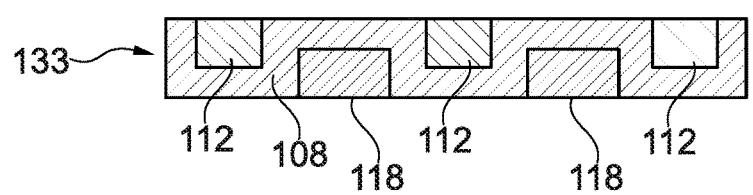

Referring to FIG. 22, the shown structure 133 is obtained by removing the carrier plate 132 and the further carrier plate 134.

Figure 23:
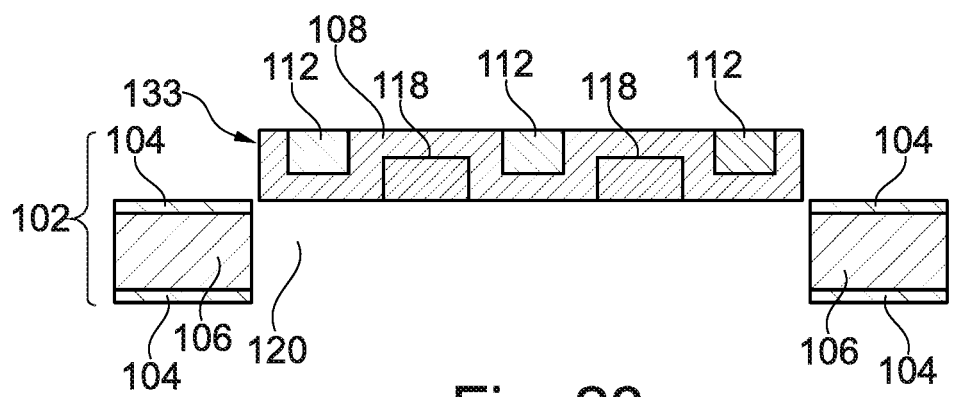

Referring to FIG. 23, the structure 133 comprising the deformed layer 108, the components 112, the further components 118 and optionally a filling medium 130 is inserted into a cavity 120 formed in a stack 102 (for instance embodied as shown in FIG. 1). In order to obtain the component carrier 100 of FIG. 1, further layer structures 104, 106 can be laminated on top and bottom of the obtained structure.

The passive array of FIG. 22 can be used as a final package or a package to be embedded in stack 102 (as shown in FIG. 23). With the described embodiments, a high embedding density may be achieved. The components 112, 118 inside can form a functional module. The final package can have a copper structuring (fan-out) on one or both sides. The passive array may be symmetrical with high dimensional stability. The components 112, 118 can have laser connections on both sides, wherein the component position is well controlled. An optionally used molding material can be used for other protection purposes (for instance shielding).

Figure 24:
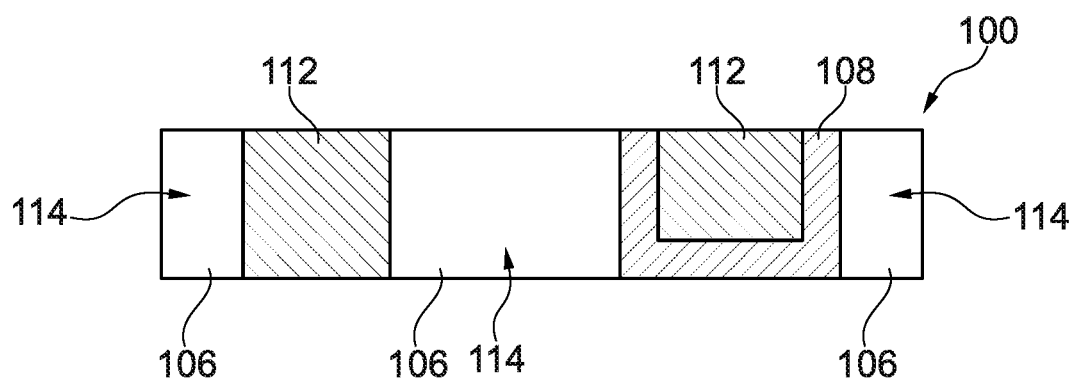
FIG. 24 and FIG. 25 illustrate cross-sectional views of component carriers according to exemplary embodiments of the invention.

FIG. 24 illustrates a cross-sectional view of a component carrier 100 according to another exemplary embodiment of the invention.

The embodiment of FIG. 24 comprises a thermo-deformed layer 108 being substantially U-shaped in the shown cross-sectional view. As a result, a component 112 can be accommodated in an accommodation volume 110 delimited by the U-shaped thermo-deformed layer 108. In the shown embodiment, a further component 112 is embedded directly in another cavity formed in an electrically insulating layer structure 106.

Figure 25:
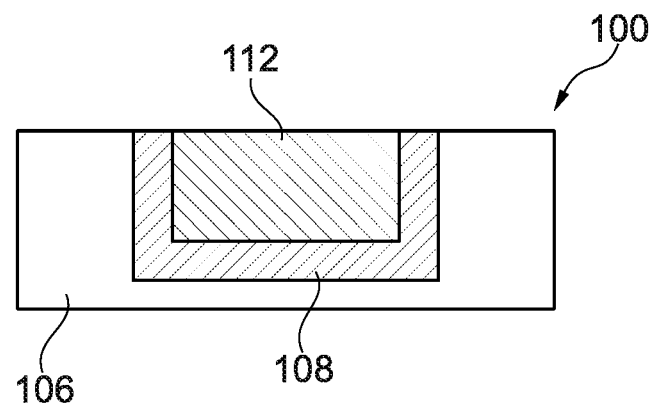

FIG. 25 illustrates a cross-sectional view of a component carrier 100 according to still another exemplary embodiment of the invention.

The embodiment of FIG. 25 comprises a cup-shaped thermo-deformed layer 108 in which a correspondingly shaped component 112 is embedded. The arrangement of deformed layer 108 and component 112 may be, in turn, embedded in a cavity of an electrically insulating layer structure 106.

FIG. 26 to FIG. 29 illustrate cross-sectional views of structures obtained during carrying out a method of manufacturing a component carrier 100 with embedded components 112 according to another exemplary embodiment of the invention.

Figure 26:
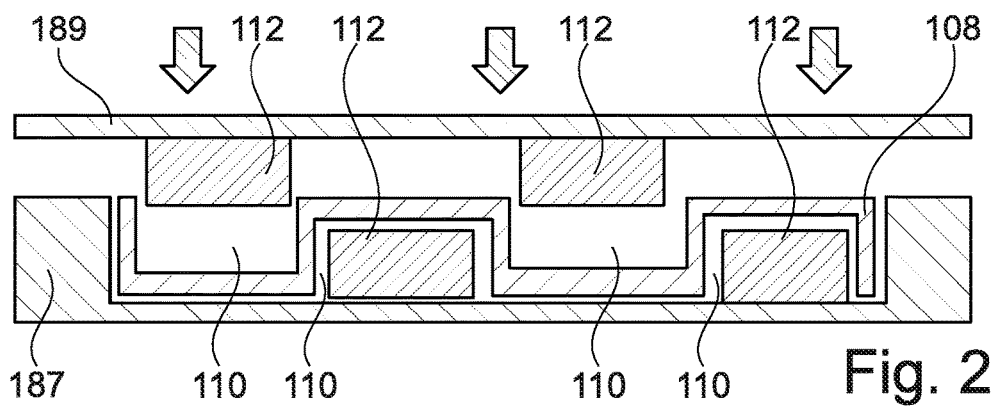
FIG. 26, FIG. 27, FIG. 28 to FIG. 29 illustrate cross-sectional views of structures obtained during carrying out a method of manufacturing a component carrier with embedded components according to another exemplary embodiment of the invention.

Referring to FIG. 26, first components 112 to be accommodated are arranged on a first handling body 187 or matrix, whereas second components 112 to be accommodated are arranged on a second handling body 189 or matrix. The deformed layer 108 defining accommodation volumes 110 may be arranged within cup-shaped first handling body 187 so as to accommodate the first components 112 in accommodation volumes 110 arranged on the bottom surface of the deformed layer 108. Components 112 attached on a lower main surface of the plate-shaped second handling body 189 may then be accommodated in accommodation volumes 110 on the top side of the deformed layer 108 by connecting the handling bodies 187, 189. The deformed layer 108 may be a thermoformed sheet. For instance, the components 112 may be printed circuit boards or modules.

Figure 27:
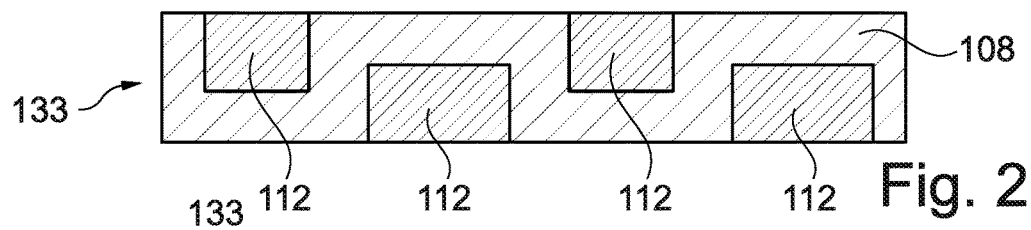

Referring to FIG. 27, a structure 133 resulting from the above-described connection procedure is shown after having removed handling bodies 187, 189.

Figure 28:
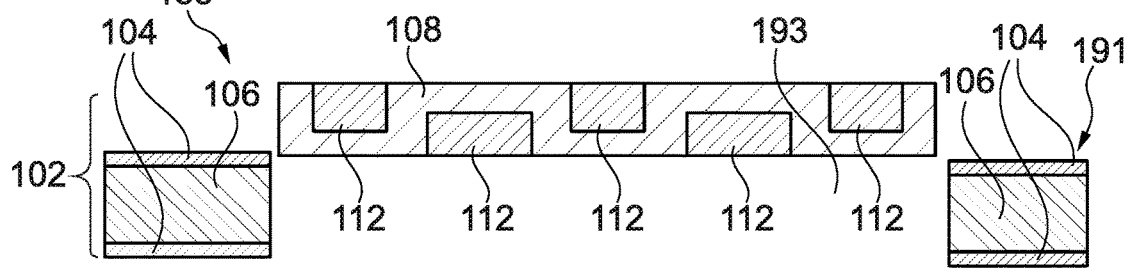

Referring to FIG. 28, the structure 133 may be additionally embedded in a through cavity 193 of a core 191.

Figure 29:
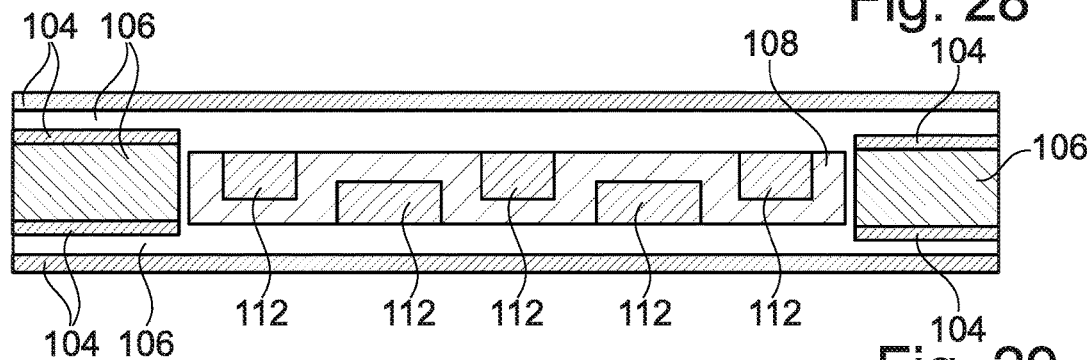

Referring to FIG. 29, one or more further electrically conductive layer structures 104 and/or one or more further electrically insulating layer structures 106 may be connected to an upper and/or lower main surface of the structure obtained by the embedding procedure shown in FIG. 26. Thus, a further build up may be carried out, if desired.

Figure 30:
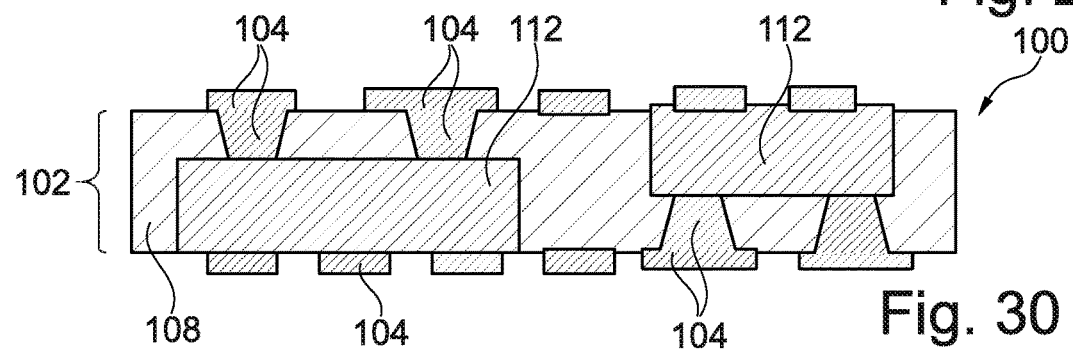
FIG. 30 illustrates a cross-sectional view of a component carrier according to another exemplary embodiment of the invention.

FIG. 30 illustrates a cross-sectional view of a component carrier 100 according to another exemplary embodiment of the invention. Such an embodiment may be denoted as an X-in-board structure. For instance, one of the shown components 112 may be a power component (for instance manufactured in PCB technology or as a module). It is also possible that the other of the shown components 112 is a signal component (for instance manufactured in PCB technology or as a module).

Figure 31:
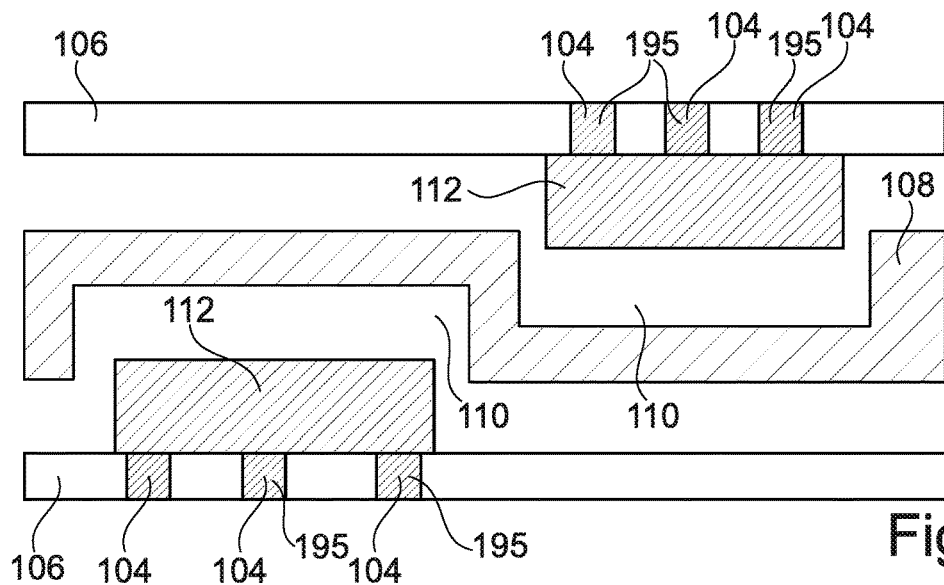
FIG. 31, FIG. 32 to FIG. 33 illustrate cross-sectional views of pre-forms of component carriers with embedded components according to exemplary embodiments of the invention.
Figure 32:
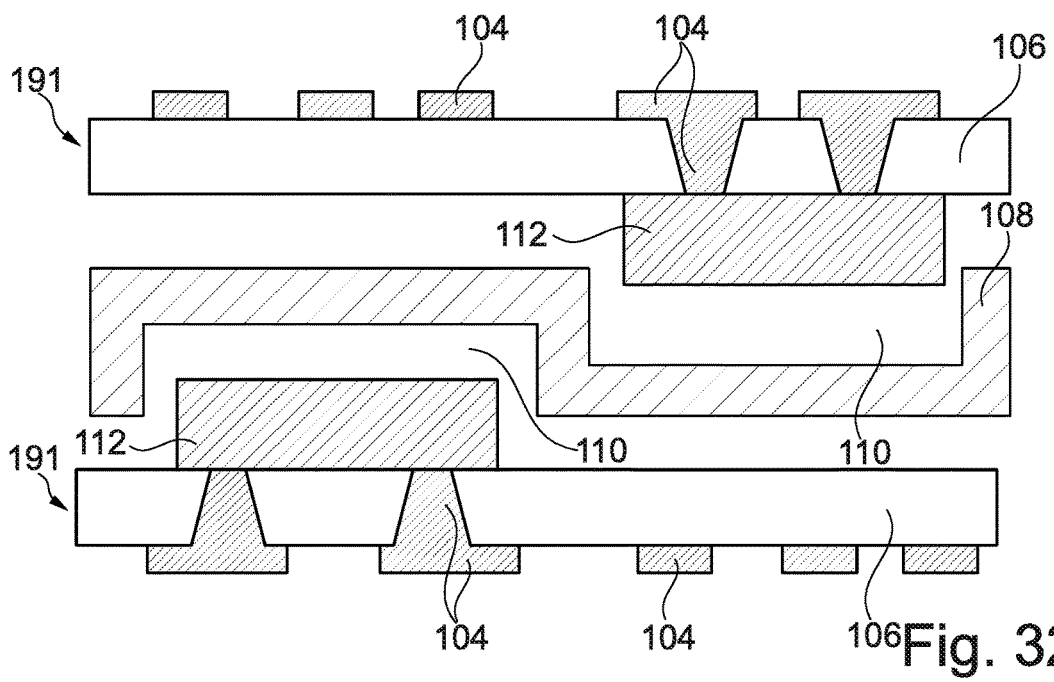
Figure 33:
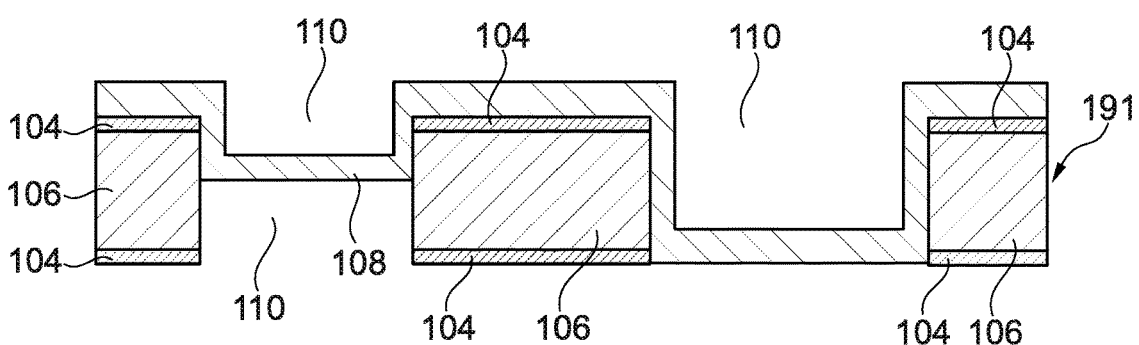

FIG. 31 to FIG. 33 illustrate cross-sectional views of preforms of component carriers 100 with embedded components 112 according to exemplary embodiments of the invention.

Referring to FIG. 31, an embodiment is shown in which the components 112 to be accommodated in the accommodation volumes 110 of the deformed layer 108 may be assembled chips with copper pillars 195.

Referring to FIG. 32, an embodiment is shown in which the components 112 to be accommodated in the accommodation volumes 110 of the deformed layer 108 may form part of an assembled PCB or core 191.

Referring to FIG. 33, depth cavities are formed as accommodation volumes 110 by attaching a deformed layer 108 to a core 191 or PCB.

Figure 34:
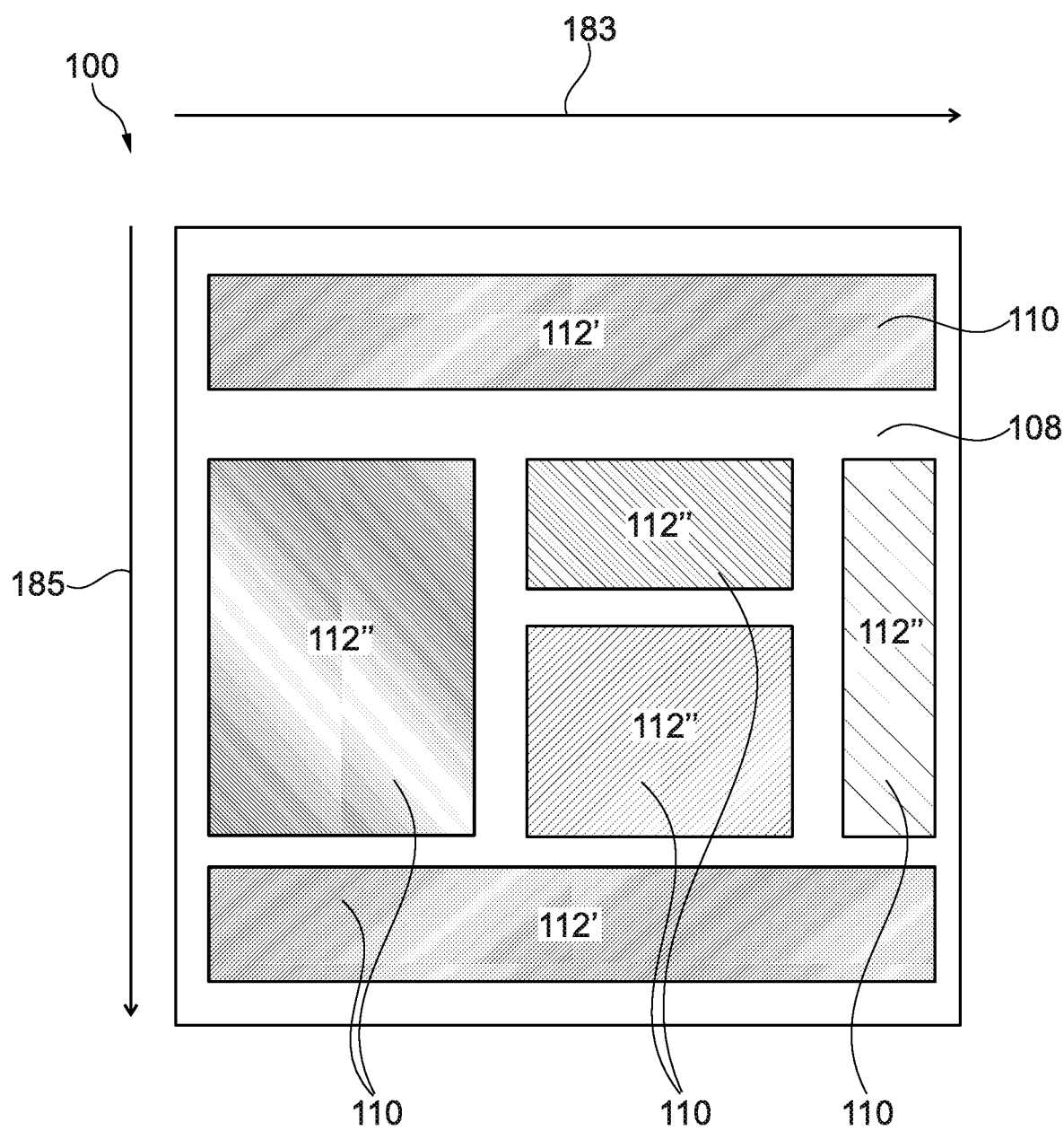
FIG. 34 illustrates a plan view of a component carrier according to a preferred embodiment of the invention in which a two-dimensionally deformed layer defines a plurality of cavities distributed over a length direction and over a width direction for accommodating a plurality of components in a two-dimensional way.

FIG. 34 illustrates a plan view of a component carrier 100 according to a preferred embodiment of the invention in which a two-dimensionally deformed layer 108 defines a plurality of cavities 110 distributed over a length direction 183 and a width direction 185 for accommodating a plurality of components 112 in a two-dimensional way.

According to FIG. 34, the deformed layer 108 is bent so as to define a two-dimensional array of accommodation volumes 110 for components 112. The two-dimensional array comprises accommodation volumes 110 arranged along length direction 183 and comprises accommodation volumes 110 arranged along width direction 185 of the deformed layer 108. The two-dimensional array has peripheral accommodation volumes 110 on the top side and on the bottom side of FIG. 34 for accommodating heat removal components 112' (such as copper inlays). Central accommodation volumes 110 accommodate heat generating components 112" (such as semiconductor chips) in between the heat removal components 112'. In order to manufacture the component carrier 100 according to FIG. 34, deformable layer 108' may be deformed to thereby form the deformed layer 108 which defines the illustrated two-dimensional array of accommodation volumes 110 comprising accommodation volumes 110 extending along the length direction 183 perpendicular to a stacking direction of the stack 102 and accommodation volumes 110 extending along the width direction 185 perpendicular to the length direction 183 and also perpendicular to the stacking direction of the stack 102. In the shown embodiment, the stacking direction is oriented perpendicular to the paper plane of FIG. 34.

Although not shown, the method may comprise deforming the deformable layer 108' to thereby form the deformed layer 108 so that the two-dimensional array of accommodation volumes 110 comprises one or more accommodation volumes 110 above and one or more accommodation volumes 110 below the deformed layer 108 (for instance in a similar way as shown in FIG. 31 to FIG. 33, but in two perpendicular directions). Alternatively, all accommodation volumes 110 may be formed on the same side of the deformed layer 108.

Descriptively speaking, the component carrier 100 shown in FIG. 34 may be configured as a PCB modularization. Components 112' may be thermal modules, whereas components 112" may be functional modules of the same or different designs. For instance, the components 112" may have different functions (for instance power related functions, signal transmission functions, etc.). Each of the components 112" can be a printed circuit board (PCB), an IC (integrated circuit) substrate, a substrate like PCB (SLP), an any-layer-structure, etc. The various components 112" may have different design capabilities, such as different line-space properties, different copper thickness, etc.

Summarizing, component carriers according to exemplary embodiments may have significant advantages in terms of process, design and use of materials. More specifically, advantages encompass a high density and flexibility, but also a high flexibility in terms of functionality. What concerns density and flexibility, advantages of exemplary embodiments of the invention are high density packaging, low routing density, dimensional stability (in particular strongly suppressed warpage), symmetrical design (it is for instance possible to use dummy components), flexible morphologies, suitability for X-in-board solutions, suitability for module embedding, possibility to use a PCB or a core as matrix, and the possibility to use double-sided processes. What concerns advantages in terms of flexibility with a focus on functionality, sealing and shielding may be obtained (for instance with magnetic or mechanical solutions), epoxy mold compounds may be used (which may simplify interaction with semiconductor dies), photo-imageable materials may be used to build connections, no interactions with PCB processes may occur (which results in a flexible selection of materials), and the possibility to use sheets or liquid resins.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
    a stack including at least one electrically conductive layer structure and/or at least one electrically insulating layer structure;
    a deformed layer connected to and/or forming part of the stack and being bent so as to define accommodation volumes for components; and
    the components, wherein each of the components is accommodated in a respective one of the accommodation volumes;
    wherein different accommodation volumes have different shapes and/or dimensions;
    wherein the components are arranged side by side;
    wherein the stack comprises a support body having recesses;
    wherein the deformed layer is attached to the support body and is bent to extend into the recesses so that the accommodation volumes are at least partially arranged in the recesses of the support body.

2. The component carrier according to claim 1, further comprising at least one of the following features:
    wherein the deformed layer is a thermo-deformed layer;
    wherein the deformed layer comprises at least one of a group consisting of resin, resin with reinforcing particles, epoxy derivatives, polyimide, polyamide, and liquid crystal polymer.

3. The component carrier according to claim 1, further comprising at least one of the following features:
    wherein the deformed layer covers horizontal surface portions and vertical sidewall portions of the support body;
    wherein the deformed layer bridges the recesses without contact to the support body in the recesses;
    at least one further component arranged in a cavity defined between a bottom of the deformed layer and sidewalls of one of the recesses of the support body, wherein one of the components in one of the accommodation volumes and the at least one further component are arranged above each other separated by the deformed layer.

4. The component carrier according to claim 1, further comprising at least one of the following features:
    wherein the deformed layer consists of electrically insulating material;
    wherein shape and dimensions of at least one of the components substantially corresponds to shape and dimensions of an assigned one of the accommodation volumes;
    wherein at least one of the accommodation volumes is delimited on one side of the deformed layer and at least one other of the accommodation volumes is delimited on an opposing other side of the deformed layer;
    wherein the deformed layer is deformed for delimiting an accommodation volume configured to correspond to a shape of a component to be accommodated in the accommodation volume;
    wherein the deformed layer is bent so as to define a two-dimensional array of accommodation volumes for components, wherein the two-dimensional array comprises at least two accommodation volumes arranged along a length direction and at least two accommodation volumes arranged along a width direction of the deformed layer, and/or wherein the two-dimensional array comprises at least one first accommodation volume accommodating at least one heat removal component and comprises at least one second accommodation volume accommodating at least one heat generating component;

wherein the components are selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an opto-electronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one of the at least one electrically conductive layer structure comprises at least one of a group consisting of copper, aluminum, nickel, silver, gold, palladium, and tungsten, any of the mentioned materials being optionally coated with supra-conductive material;

wherein at least one of the at least one electrically insulating layer structure comprises at least one of a group consisting of at least one of a reinforced resin, a non-reinforced resin, epoxy resin, bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;

wherein the component carrier is shaped as a plate;

wherein the component carrier is configured as one of a group consisting of a printed circuit board, and a substrate, or a preform thereof;

wherein the component carrier is configured as a laminate-type component carrier.

5. A method of manufacturing a component carrier, the method comprising:

providing a stack including at least one electrically conductive layer structure and/or at least one electrically insulating layer structure;

deforming a deformable layer to thereby form a deformed layer which defines a plurality of accommodation volumes for a plurality of components, wherein different accommodation volumes have different shapes and/or different dimensions; and accommodating each of the at least one component in a respective one of the at least one accommodation volume, wherein the components are arranged side by side;

deforming the deformable layer by applying a deforming force by a deforming body which includes a base and protrusions extending from the base and defining the accommodation volumes, wherein the method comprises deforming the deformable layer by pressing the one or more protrusions onto a front side of the deformable layer while a back side of the deformable layer is pressed partially onto a support body and partially into recesses of the support body, which recesses correspond to the accommodation volumes;

the method further comprising at least one of the following:

inserting each component in a respective one of the accommodation volumes so that each component is also inserted at least partially into a respective one of the recesses of the support body;

at least partially filling gaps between the deformed layer and the support body with filling medium by laminating at least one of the at least one electrically insulating layer structure to the deformed layer and the support body.

6. The method according to claim 5, further comprising at least one of the following:

thermo-deforming the deformable layer to thereby define the accommodation volumes;

deforming the deformable layer to thereby form a plastically deformed layer;

deforming the deformable layer by applying mechanical pressure and heat.

7. A method of manufacturing a component carrier, the method comprising:

providing a stack including at least one electrically conductive layer structure and/or at least one electrically insulating layer structure;

deforming a deformable layer to thereby form a deformed layer which defines a plurality of accommodation volumes for a plurality of components, wherein different accommodation volumes have different shapes and/or different dimensions; and accommodating each of the at least one component in a respective one of the at least one accommodation volume;

wherein the components are arranged side by side;

wherein accommodating the at least one component in the accommodation volumes is carried out so that upper surfaces of the components and of the deformed layer are aligned with one another.

8. A method of manufacturing a component carrier, the method comprising:

providing a stack including at least one electrically conductive layer structure and/or at least one electrically insulating layer structure;

deforming a deformable layer to thereby form a deformed layer which defines a plurality of accommodation volumes for a plurality of components, wherein different accommodation volumes have different shapes and/or different dimensions;

accommodating each of the at least one component in a respective one of the at least one accommodation volume, wherein the components are arranged side by side; and attaching the components on a carrier plate and subsequently approaching the carrier plate to the deformed layer so that each of the components attached to the carrier plate is accommodated in a respective one of the accommodation volumes.

9. The method according to claim 8, further comprising:

attaching at least one further component on a further carrier plate and subsequently approaching the further carrier plate to a back side of the deformed layer so that each of the at least one further component attached to the further carrier plate is accommodated in a respective one of at least one further accommodation volume on the back side of the deformed layer.

10. The method according to claim 9, further comprising at least one of the following:
- at least partially filling gaps between the deformed layer, the components and the at least one further component by a filling medium by molding;
- inserting a structure comprising the deformed layer, the components and the at least one further component into a cavity formed in the stack.

11. A method of manufacturing a component carrier, the method comprising:
- providing a stack including at least one electrically conductive layer structure and/or at least one electrically insulating layer structure;
- deforming a deformable layer to thereby form a deformed layer which defines a plurality of accommodation volumes for a plurality of components, wherein different accommodation volumes have different shapes and/or different dimensions;
- accommodating each of the at least one component in a respective one of the at least one accommodation volume, wherein the components are arranged side by side; and
- deforming the deformable layer to thereby form the deformed layer which defines a two-dimensional array of accommodation volumes comprising at least two accommodation volumes extending along a first direction perpendicular to a stacking direction of the stack and having at least two accommodation volumes extending along a second direction perpendicular to the first direction and perpendicular to the stacking direction of the stack,
- wherein the method comprises deforming the deformable layer to thereby form the deformed layer so that the two-dimensional array of accommodation volumes includes at least one accommodation volume above and at least one accommodation volume below the deformed layer.

12. A method of manufacturing a component carrier, the method comprising:
- providing a stack including at least one electrically conductive layer structure and/or at least one electrically insulating layer structure;
- deforming a deformable layer to thereby form a deformed layer which defines a plurality of accommodation volumes for a plurality of components, wherein different accommodation volumes have different shapes and/or different dimensions;
- accommodating each of the at least one component in a respective one of the at least one accommodation volume, wherein the components are arranged side by side;
- thermo-deforming the deformable layer to thereby define the accommodation volumes; and
- using an at least partially uncured B-stage resin for the thermo-deformable layer, wherein the method comprises curing the at least partially uncured material of the thermo-deformable layer to thereby fill an empty space within the component carrier during curing.

* * * * *